(12) United States Patent
Yin et al.

(10) Patent No.: US 10,204,813 B2
(45) Date of Patent: Feb. 12, 2019

(54) WAFER DE-BONDING DEVICE

(71) Applicant: Zhejiang Microtech Material Co., Ltd., Zhejiang (CN)

(72) Inventors: Ming Yin, Zhejiang (CN); Hao Tang, San Diego, CA (US)

(73) Assignee: Zhejiang Microtech Material Co., Ltd., Zhejiang (CN)

( * ) Notice: Subject to any disclaimer, the term of this patent is extended or adjusted under 35 U.S.C. 154(b) by 0 days.

(21) Appl. No.: 15/534,196

(22) PCT Filed: Jul. 16, 2015

(86) PCT No.: PCT/CN2015/084182
§ 371 (c)(1),
(2) Date: Jun. 8, 2017

(87) PCT Pub. No.: WO2017/004843
PCT Pub. Date: Jan. 12, 2017

(65) Prior Publication Data
US 2018/0108558 A1    Apr. 19, 2018

(30) Foreign Application Priority Data
Jul. 8, 2015  (CN) .......................... 2015 1 0404757

(51) Int. Cl.
*B32B 43/00*    (2006.01)
*H01L 21/683*   (2006.01)
(Continued)

(52) U.S. Cl.
CPC ........ *H01L 21/6835* (2013.01); *B32B 43/006* (2013.01); *H01L 21/67* (2013.01);
(Continued)

(58) Field of Classification Search
CPC . B32B 38/10; B32B 43/006; Y10T 156/1158; Y10T 156/1179;
(Continued)

(56) References Cited

U.S. PATENT DOCUMENTS

| 6,221,740 B1* | 4/2001 | Bryan ................. B28D 5/0011 |
| | | 125/23.01 |
| 8,756,783 B2* | 6/2014 | Lu ....................... G02F 1/1303 |
| | | 156/247 |

(Continued)

*Primary Examiner* — Mark A Osele
*Assistant Examiner* — Nickolas R Harm
(74) *Attorney, Agent, or Firm* — Radlo IP Law Group; Peter Su

(57) ABSTRACT

A wafer de-bonding device comprises a stage (1) for holding a device wafer and a carrier wafer bonded together, and a tool (2) with a gas outlet (2.2) disposed in proximity to the stage (1) through an adjustment device for control the tool (2) to move towards or away from the stage (1), the tool (2) being provided with a bit (2.1) to cut a notch into a film or an adhesive layer at a junction of the bonded wafers, the gas outlet (2.2) being provided on the tool bit (2.1), the tool (2) being further provided with a gas inlet (2.3) in communication with the gas outlet (2.2), the gas inlet (2.3) being connected to a gas jet generator so as to direct a gas jet towards the junction of the bonded wafers on the stage (2). The wafer de-bonding device has a high degree of automation and simple operations.

8 Claims, 3 Drawing Sheets

(51) Int. Cl.
*H01L 21/67* (2006.01)
*H01L 21/687* (2006.01)
*B32B 38/10* (2006.01)

(52) U.S. Cl.
CPC .. *H01L 21/67017* (2013.01); *H01L 21/67092* (2013.01); *H01L 21/67109* (2013.01); *H01L 21/67253* (2013.01); *H01L 21/6838* (2013.01); *H01L 21/68714* (2013.01); *B32B 38/10* (2013.01); *B32B 2457/14* (2013.01); *H01L 2221/68381* (2013.01); *Y10T 156/1132* (2015.01); *Y10T 156/1137* (2015.01); *Y10T 156/1158* (2015.01); *Y10T 156/1179* (2015.01); *Y10T 156/1184* (2015.01); *Y10T 156/1939* (2015.01); *Y10T 156/1944* (2015.01); *Y10T 156/1961* (2015.01); *Y10T 156/1967* (2015.01)

(58) Field of Classification Search
CPC ......... Y10T 156/1184; Y10T 156/1939; Y10T 156/1944; Y10T 156/1961; Y10T 156/1967
USPC ....... 156/707, 708, 716, 717, 757, 758, 761, 156/762, 930
See application file for complete search history.

(56) References Cited

U.S. PATENT DOCUMENTS

| | | | |
|---|---|---|---|
| 9,266,315 B2* | 2/2016 | Iizuka | B32B 43/006 |
| 2005/0150597 A1* | 7/2005 | Henley | B28D 5/00 156/755 |
| 2006/0199382 A1* | 9/2006 | Sugiyama | H01L 21/67132 438/670 |
| 2013/0206331 A1* | 8/2013 | Ho | B26F 3/004 156/247 |
| 2014/0332166 A1* | 11/2014 | Honda | H01L 21/67092 156/708 |
| 2015/0096689 A1* | 4/2015 | Wimplinger | H01L 21/67092 156/701 |
| 2015/0202857 A1* | 7/2015 | Morikazu | B32B 43/006 156/751 |
| 2015/0318200 A1* | 11/2015 | Ohno | H01L 21/6838 414/797 |
| 2015/0328872 A1* | 11/2015 | Koyanagi | B23K 26/0853 156/73.1 |
| 2016/0016397 A1* | 1/2016 | Xie | B32B 43/006 156/758 |
| 2016/0111316 A1* | 4/2016 | Huang | H01L 21/6838 156/701 |

* cited by examiner

WAFER DE-BONDING DEVICE

The present application is a U.S. National Phase Application under 35 U.S.C. 371 and claims the benefit of priority to PCT International Application No. PCT/CN2015/084182, filed on 16 Jul. 2015, which claims the benefit of priority of Chinese Patent Application No. 201510404757.1, filed on 8 Jul. 2015, the entire disclosures of which are incorporated by reference herein in their entireties for all purposes.

FIELD OF THE INVENTION

The present invention relates to the field of microelectronics technology, and more particularly, to a wafer de-bonding device.

BACKGROUND OF THE INVENTION

With the trend towards miniaturization of electronic products, electronic chips also become thinner and thinner. When a Silicon wafer is thinned to a thickness of 100 microns or less, however, it may easily break or bend due to stress applied thereon during processing. As a result, it is almost impossible to process such an ultra-thin wafer directly. In order to process an ultra-thin wafer, it usually needs to be temporarily bonded to a carrier wafer. While the ultra-thin wafer and the carrier wafer are bonded together as one piece, the ultra-thin wafer can be subjected to processes such as thinning, and formation of TSVs, re-distribution layers, and internal interconnections. Then, the ultra-thin wafer and the carrier wafer are separated from each other, and the thinned wafer is cleaned and cut into individual chips, thereby completing the processing of the ultra-thin wafer.

At present, a device wafer is generally bonded to a carrier wafer by coating a layer of adhesive therebetween and then bonding them to each other in a bonding machine. A process of separating the bonded device wafer and carrier wafer is known as de-bonding.

Generally, there are several methods to de-bond the temporarily bonded wafers. A first method is to dissolve the bonding adhesive in a solvent from the edge of the bonded device wafer and carrier wafer. A second method is to separate them by thermal shearing. With the first method, the solvent dissolves the bonding adhesive slowly from the edge of the junction where the device wafer and carrier wafer are bonded together, and it will take a long time for the solvent to reach the center of the device wafer, resulting in a very low efficiency. In addition, it needs a special plate to secure the device wafer so as to prevent the device wafer from mixing with the carrier wafer while separating them, which causes a complex procedure and a high cost. As to the second method, it needs a special equipment to carry out the thermal shearing process, which also causes a high cost, and the thermal shearing process is easy to damage the device wafer and thus has a low yield.

In view of the above, the inventors proposed a wafer de-bonding method in which a surface of the carrier wafer is treated and an isolation film is formed thereon. The isolation film is adhered to the carrier wafer with a proper adhesion force so that it would not fall off the carrier wafer if nobody tears it intentionally, but it would be peeled off from the carrier wafer if somebody tears it with a force. Then, a layer of adhesive may be coated between the front surface of the carrier wafer with the isolation film thereon and a device wafer so as to bond them together. The inventors also proposed a wafer de-bonding method in which a gas jet generator produces a gas jet towards a junction between the device wafer and the carrier wafer so as to separate them. However, the inventors found out that it still needs a wafer de-bonding device with a high degree of automation and simple and convenient operations in order to meet requirements of industrial production.

SUMMARY OF THE INVENTION

A technical problem to be solved by the present invention is to overcome the defects in the prior art and to provide a wafer de-bonding device with a high degree of automation and simple and convenient operations.

According to an aspect, the present invention provides a wafer de-bonding device comprising a stage for holding a device wafer and a carrier wafer bonded together, and a tool having a gas outlet, the tool being disposed in proximity to the stage and mounted to an adjustment device which controls the tool to move towards or away from the stage, the tool being provided with a bit for penetrating into a film or an adhesive layer at a junction between the bonded device wafer and carrier wafer to form a notch, the gas outlet being provided on the tool bit, the tool further having a gas inlet in communication with the gas outlet, the gas inlet being connected to a gas jet generator to deliver a gas jet towards the junction between the bonded device wafer and carrier wafer placed on the stage.

With the above configuration, the tool may cut a notch into the junction where the wafers are bonded, and then the gas jet generator may deliver a gas jet towards the notch so as to de-bond the device wafer and the carrier wafer from each other. As the gas outlet is provided on the tool bit, it may directly face to the notch and produces a very good result when it is used. The two wafers may be separated with a modest gas pressure, the separation may be performed quickly, and the operation is very simple and convenient.

In proximity to the stage are further provided an image acquisition device and a light source. The image acquisition device may have its image acquisition end directed to the tool bit to capture an image of the tool bit approaching the junction where the device wafer and the carrier wafer are bonded. The light source provides light illumination to make the image more clear. With this configuration, the image captured by the image acquisition device may be referenced to determine whether the tool bit is aligned to the junction where the wafers are bonded. If not, the position of the tool bit may be adjusted through the adjustment device. Since the wafer de-bonding device often operates in an enclosed space, the light source is necessary to make the captured image more clear.

The wafer de-bonding device further includes a robotic arm equipped with suckers which can suck on upper one of the bonded device wafer and carrier wafer on the stage so as to remove it when it is separated from the lower one of the bonded device wafer and carrier wafer by the gas jet. The robotic arm sucks through the suckers on the upper surface of upper one of the bonded device wafer and carrier wafer on the stage and applies a slight lift force. With the gas jet, when a gap appears between the upper and lower wafers, the robotic arm can easily separate the upper and lower wafers completely since the adhesive force therebetween is weak. Then, the robotic arm can move the separated upper wafer to another place for subsequent processing. The entire process may be implemented automatically by programming, and the wafer de-bonding device has a high degree of automation.

The wafer de-bonding device further includes a controller in communication with the image acquisition device and the adjustment device. The image of the junction between the bonded wafers captured by the image acquisition device may be processed and analyzed by the controller to adjust position of the tool through the adjustment device such that the tool bit may be automatically aligned to the junction where the device wafer and carrier wafer are bonded. By programming within the controller, the position of the tool bit may be automatically controlled based on the image captured by the image acquisition device, thereby ensuring the tool bit being always aligned to the junction of the bonded wafers, achieving automatic adjustment and a high degree of automation.

The light source irradiates light at an angle onto the bonded device wafer and carrier wafer on the stage, and the light may be of a color that can be sensed by the image acquisition device. The light can pass through the device wafer and the carrier wafer and be reflected by the film where the device wafer and the carrier wafer are bonded. With such a configuration, when light is irradiated onto the wafers, the device wafer, the carrier wafer, and the bonding film between the device wafer and the carrier wafer have different effects on the incident light of the same wavelength. Specifically, the film reflects the light, while the device wafer and the carrier wafer transmit the light. Consequently, there is a large difference in color between the film and the wafers in the image of the junction of the bonded wafers captured by the image acquisition device and thus the image has a high resolvability and results in an accurate operation. The light may be, for example, ultraviolet light, visible purple light, or the like.

The wafer de-bonding device further includes a gas temperature adjustment device provided between the gas jet generator and the gas inlet for adjusting temperature of the gas jet output from the gas outlet. With such a device, the temperature of the gas jet may be adjusted while it blows, and either hot or cold gas may blows to facilitate subsequent processing.

In a preferred embodiment, the gas outlet may be provided on the upper surface of the bit of the tool. With such a configuration, the gas jet may blow through the gas outlet while the tool bit cuts a notch, thereby achieving simple and convenient operations.

There may be two gas outlets provided in the upper surface of the tool bit, and a tapered slot provided in a side surface of the tool. Using two gas outlets may make the gas jet more stable, and the tapered slot may accommodate a gas tube connected to the gas inlet as well the image acquisition device and cables connected to the image acquisition device.

Reference signs: 1, stage; 2, tool; 2.1, tool bit; 2.2, gas outlet; 2.3, gas inlet; 2.4, tapered slot; 3, robotic arm; 3.1, sucker; 3.2, displacement mechanism; 4, light source; 5, cabinet.

DETAILED DESCRIPTION OF THE PREFERRED EMBODIMENTS

The present invention will be described in detail below with reference to the accompanying drawings and specific embodiments.

Figure 1:
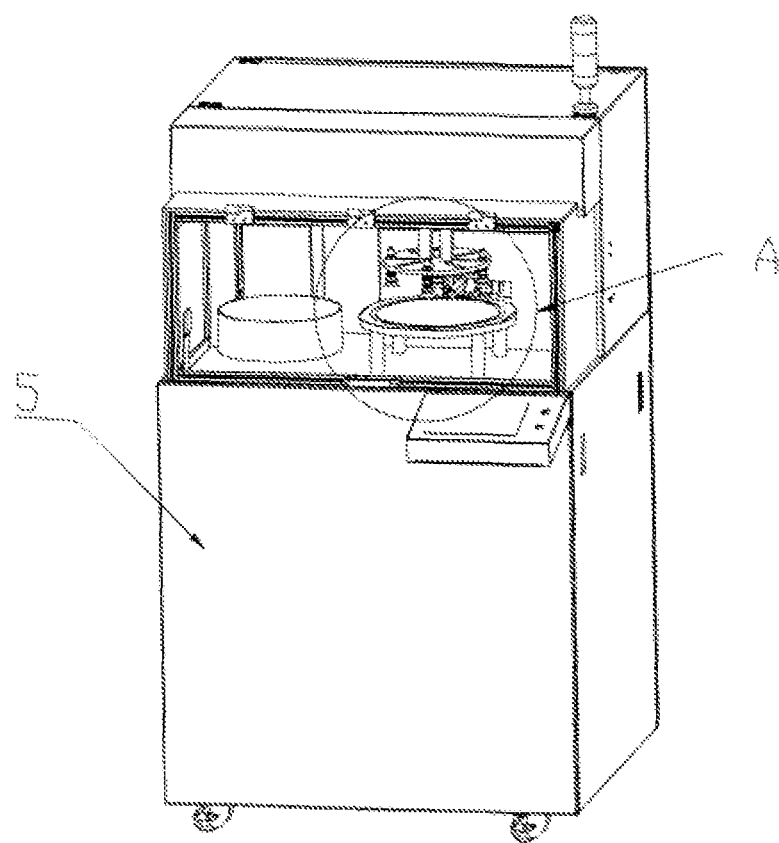
FIG. 1 is a structural diagram showing an embodiment of a wafer de-bonding device according to the present invention.
Figure 2:
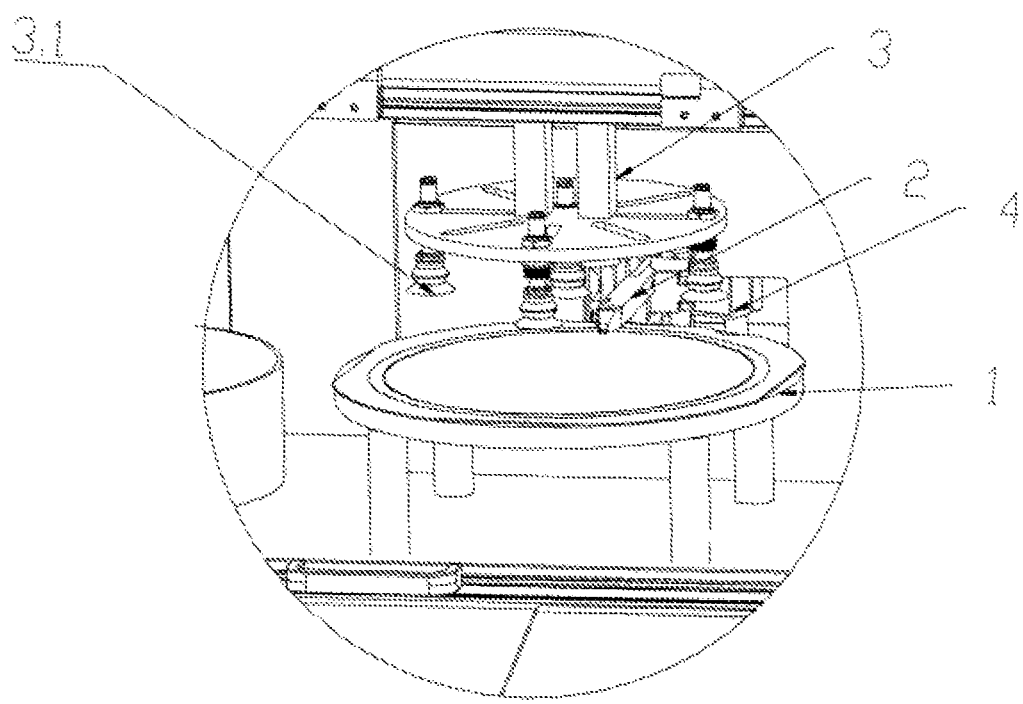
FIG. 2 is a close-up diagram of the portion A in FIG. 1.
Figure 3:
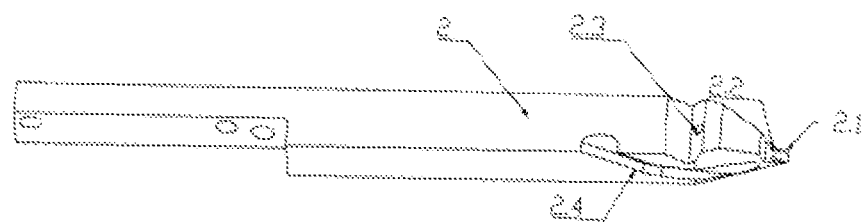
FIG. 3 is a structural diagram of a tool.
Figure 4:
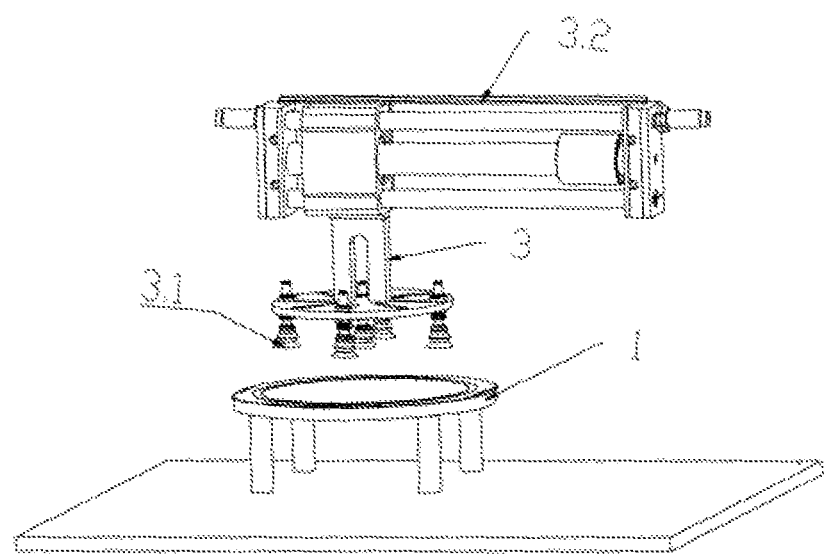
FIG. 4 is a structural diagram of a robotic arm and suckers.

As shown in FIGS. 1-4, the present invention provides a wafer de-bonding device including a stage 1 for holding bonded wafers, and a tool 2 with a gas outlet 2.2 disposed in proximity to the stage and mounted to an adjustment device which controls the tool 2 to move towards or away from the stage 1. The adjustment device may include a displacement mechanism such as an electric cylinder or a gas cylinder and a step motor to finely adjust position of the tool 2, which belongs to prior arts and will not be described in detail here. The tool 2 is provided with a bit 2.1, which may be used to cut a notch at a junction of the bonded device wafer and carrier wafer. The gas outlet 2.2 may be disposed in an upper surface of the tool bit 2.1. In other embodiments, of course, the gas outlet 2.2 may also be disposed in a lower surface of the tool bit 2.1 to direct a gas jet towards the junction of the bonded device wafer and carrier wafer. The tool 2 is further provided with a gas inlet 2.3 in communication with the gas outlet 2.2. The gas inlet 2.3 is connected to a gas jet generator so as to deliver the gas jet to the junction of the bonded wafers on the stage 1. The gas jet generator may have an output port connected to the gas inlet 2.3 to deliver the gas jet towards the junction of the bonded wafers through the gas outlet 2.2. The gas jet generator may be disposed inside a cabinet and is therefore not shown in the drawing.

As can be seen from embodiments, the wafer de-bonding device may further include a cabinet 5 and some other peripheral structures, which are all components that may or may not be equipped while the device is manufactured. However, they all fall within the scope of the present invention as long as they are used along with the basic configuration to realize wafer de-bonding as disclosed herein.

With the above configuration, the tool may cut a notch into the junction where the wafers are bonded, and then the gas jet generator may deliver a gas jet towards the notch so as to de-bond the device wafer and the carrier wafer from each other. As the gas outlet is provided in the upper surface of the tool, it may directly face to the notch and produces a very good result when it is used. The two wafers may be separated with a modest gas pressure, the separation may be performed quickly, and the operation is very simple and convenient.

In proximity to the stage are further provided an image acquisition device and a light source 4. The image acquisition device has its image acquisition end directed to the bit 2.1 of the tool 2 to capture an image of the tool bit 2.1 approaching the junction of the bonded wafers. The light source 4 provides light illumination to make the image more clear. Only the light source 4 is shown in the drawings, while the image acquisition device is blocked by the cabinet 5 and thus not shown in the drawings. The image acquisition device itself belongs to the prior arts, and here the arrangement of the image acquisition device has been described clearly even it is not shown. In the embodiment, the image acquisition device may be a camera. With such a configuration, the image captured by the image acquisition device may be referenced to determine whether the tool bit is aligned to the junction where the wafers are bonded. If not, the position of the tool bit may be adjusted through the adjustment device. Since the wafer de-bonding device often operates in an enclosed space, the light source is necessary to make the captured image more clear.

The wafer de-bonding device further includes a robotic arm 3 equipped with suckers 3.1 which can suck on upper one of the bonded device wafer and carrier wafer on the stage so as to remove it when it is separated from the lower one of the bonded device wafer and carrier wafer by the gas jet. The robotic arm may be driven by an electric cylinder or a gas cylinder and move the upper one of the bonded wafers to another place after it is separated from the lower one of the bonded wafers. As a typical case, the carrier wafer may be on the upper side, and the device wafer may be on the lower side, but vice versa. The stage may be provided with a plurality of vacuum holes to suck the device wafer on the lower side with an even sucking force, and the carrier wafer on the upper side may be sucked by the suckers of the robotic arm. When the device wafer and the carrier wafer are separated from each other by the gas jet, the robotic arm may move the carrier wafer to another place to facilitate subsequent processing of the device wafer. The entire process may be implemented automatically by programming, and the wafer de-bonding device has a high degree of automation.

The wafer de-bonding device further includes a controller in communication with the image acquisition device and the adjustment device. The image of the junction between the bonded wafers captured by the image acquisition device may be processed and analyzed by the controller to adjust position of the tool through the adjustment device such that the tool bit may be exactly aligned to the junction of the bonded wafers. By programming within the controller, the position of the tool bit may be automatically controlled based on the image captured by the image acquisition device, thereby ensuring the tool bit being always aligned to the junction of the bonded wafers, achieving automatic adjustment and a high degree of automation. A program to control position of an object based on its image is commonly used in the prior arts and thus it will not be discussed in detail here. However, it should be noted that the method of adjusting position of the tool bit based on the image of the tool bit at the junction of the bonded wafers as used in the wafer de-bonding device of the present invention is novel in the art.

The light source irradiates light at an angle onto the bonded device wafer and carrier wafer on the stage, and the light may be of a color that can be sensed by the image acquisition device. The light can pass through the device wafer and the carrier wafer and be reflected by the film where the device wafer and the carrier wafer are bonded. With such a configuration, when the light is irradiated onto the wafers, the device wafer, the carrier wafer, and the bonding film between the device wafer and the carrier wafer have different effects on the incident light of the same wavelength. Specifically, the film reflects the light, while the device wafer and the carrier wafer transmit the light. Consequently, there is a large difference in color between the film and the wafers in the image of the junction of the bonded wafers captured by the image acquisition device, and thus the image has a high resolvability and results in an accurate operation. The light may be, for example, ultraviolet light, visible purple light, or any other light as long as it can be reflected at the film between the bonded wafers in a manner different from at the bonded wafers and can be sensed by the image acquisition device. When such a light is irradiated onto the stage, it can pass through the wafers but be reflected by the film where the wafers are bonded, producing an image in which the film has a color greatly different from the device wafer and the carrier wafer so that the film may be recognized more accurately.

The wafer de-bonding device further includes a gas temperature adjustment device provided between the gas jet generator and the gas inlet for adjusting temperature of the gas jet output from the gas outlet. With such a device, the temperature of the gas jet may be adjusted while it blows, and either hot or cold gas may blows to facilitate subsequent processing.

In a preferred embodiment, the gas outlet may be provided in the upper surface of the bit of the tool. With such a configuration, the gas jet may blow through the gas outlet while the tool bit cuts a notch, thereby achieving simple and convenient operations.

There may be two gas outlets provided in the upper surface of the tool bit, and a tapered slot provided in a side surface of the tool. Using two gas outlets may make the gas jet more stable, and the tapered slot may be used to accommodate a gas tube connected to the gas inlet as well the image acquisition device and cables connected to the image acquisition device.

What is claimed and desired to be secured by Letters Patent of the United States is:

1. A wafer de-bonding device, comprising:
    a stage for holding a device wafer and a carrier wafer bonded together;
    a tool with a gas outlet disposed on an adjustable device for controlling the tool to move towards or away from the stage, the tool being provided with a bit to penetrate into a film or an adhesive layer at a junction between the device wafer and the carrier wafer bonded together to form a notch, the gas outlet being disposed on the tool bit, the tool being further provided with a gas inlet in communication with the gas outlet, the gas inlet being connected to a gas jet generator to deliver a gas jet towards the junction between the device wafer and the carrier wafer bonded together on the stage; and
    an image acquisition device having an image acquisition end directed to the bit of the tool to acquire an image of the tool bit approaching the junction of the bonded wafers.

2. The wafer de-bonding device of claim 1, further comprising a light source providing light illumination for the image acquisition device to acquire the image.

3. The wafer de-bonding device of claim 2, wherein the light source irradiates light at an angle onto the bonded wafers on the stage, the light has a color that is sensible for the image acquisition device, and the light passes through the device wafer and the carrier wafer and is reflected by the film at the junction of the bonded wafers.

4. The wafer de-bonding device of claim 1, further comprising a robotic arm equipped with a sucker through which the robotic arm sucks on upper one of the bonded device wafer and carrier wafer on the stage and remove it when it is separated from the lower one of the bonded device wafer and carrier wafer through the gas jet.

5. The wafer de-bonding device of claim 1, further comprising a controller in communication with the image acquisition device and the adjustment device, the controller being configured to process and analyze the image captured by the image acquisition device so as to control the position of the tool through the adjustment device such that the bit of the tool is automatically aligned to the junction between the bonded wafers.

6. The wafer de-bonding device of claim 1, further comprising a gas temperature adjustment device provided between the gas jet generator and the gas inlet to adjust temperature of the gas jet output from the gas outlet.

7. The wafer de-bonding device of claim 1, wherein the gas outlet is disposed in an upper surface of the tool bit.

8. The wafer de-bonding device of claim 1, wherein the tool bit has two gas outlets provided in an upper surface thereof, and the tool has a tapered slot provided in a side surface thereof.

* * * * *